US012112982B2

United States Patent
Mohseni et al.

(10) Patent No.: US 12,112,982 B2
(45) Date of Patent: Oct. 8, 2024

(54) NANOSCALE RESOLUTION, SPATIALLY-CONTROLLED CONDUCTIVITY MODULATION OF DIELECTRIC MATERIALS USING A FOCUSED ION BEAM

(71) Applicant: Northwestern University, Evanston, IL (US)

(72) Inventors: Hooman Mohseni, Wilmette, IL (US); Simone Bianconi, Evanston, IL (US)

(73) Assignee: Northwestern University, Evanston, IL (US)

( * ) Notice: Subject to any disclaimer, the term of this patent is extended or adjusted under 35 U.S.C. 154(b) by 711 days.

(21) Appl. No.: 17/293,276

(22) PCT Filed: Nov. 7, 2019

(86) PCT No.: PCT/US2019/060183
§ 371 (c)(1),
(2) Date: May 12, 2021

(87) PCT Pub. No.: WO2020/159596
PCT Pub. Date: Aug. 6, 2020

(65) Prior Publication Data
US 2022/0020635 A1    Jan. 20, 2022

Related U.S. Application Data

(60) Provisional application No. 62/760,993, filed on Nov. 14, 2018.

(51) Int. Cl.
*H01L 21/768*    (2006.01)
*H01L 21/42*    (2006.01)

(52) U.S. Cl.
CPC ........ *H01L 21/76823* (2013.01); *H01L 21/42* (2013.01); *H01L 21/76825* (2013.01); *H01L 21/76843* (2013.01)

(58) Field of Classification Search
CPC ................... H01L 21/76823; H01L 21/76825
See application file for complete search history.

(56) References Cited

U.S. PATENT DOCUMENTS

| 6,670,717 B2 | 12/2003 | Kane et al. |
| 7,763,552 B2 * | 7/2010 | Tong ...................... H10B 99/00 438/795 |

(Continued)

OTHER PUBLICATIONS

Simone Bianconi et al., "Giant Conductivity Modulation of Aluminum Oxide using Focused Ion Beam," ArXiv, Feb. 20, 2019; pp. 1-8.

(Continued)

*Primary Examiner* — Daniel Luke
(74) *Attorney, Agent, or Firm* — Bell & Manning, LLC (57) ABSTRACT

Methods for creating a conductive feature in a dielectric material are provided. In an embodiment, such a method comprises irradiating a region of a dielectric material having a resistivity of at least $10^8$ W cm with a focused ion beam, the irradiated region corresponding to a conductive feature embedded in the dielectric material, the conductive feature having a conductivity greater than that of the dielectric material; and forming one or more contact pads of a conductive material in electrical communication with the conductive feature, the one or more contact pads configured to apply a voltage across the conductive feature using a voltage source.

12 Claims, 11 Drawing Sheets

(56) References Cited

U.S. PATENT DOCUMENTS

| | | | |
|---|---|---|---|
| 7,948,051 B2 | 5/2011 | Colburn et al. | |
| 7,960,775 B2 | 6/2011 | Courtade et al. | |
| 8,222,696 B2 | 6/2012 | Yamazaki et al. | |
| 8,222,097 B2 * | 7/2012 | Hanaoka | H01L 21/76823 438/158 |
| 8,236,680 B2 | 8/2012 | Marks et al. | |
| 8,377,722 B2 | 2/2013 | Goulet et al. | |
| 2009/0163014 A1 | 6/2009 | Lee et al. | |
| 2011/0291284 A1 | 12/2011 | Goldfarb et al. | |

OTHER PUBLICATIONS

N. E. Sosa, J. Liu, C. Chen, T. J. Marks, M. C. Hersam, "Nanoscale Writing of Transparent Conducting Oxide Features with a Focused Ion Beam," *Advanced Materials*, 2009, vol. 21, pp. 721-725.

N. E. Sosa, C. Chen, J. Liu, S. Xie, T. J. Marks, M. C. Hersam, "Nanoscale Structure, Composition, and Charge Transport Analysis of Transparent Conducting Oxide Nanowires Written by Focused Ion Beam Implantation," *Journal of American Chemical Society*, 2010, vol. 132, pp. 7347-7354.

Junfeng Wang et al., "Scalable Fabrication of Single Silicon Vacancy Defect Arrays in Silicon Carbide Using Focused Ion Beam," ACS Photonics, 2017, vol. 4, pp. 1054-1059.

Benjamin D. Myers et al., "Directed assembly in epitaxial zinc oxide films on focused ion beam modified sapphire substrates," *Journal of Vacuum Science & Technology B*, Nanotechnology and Microelectronics: Materials, Processing, Measurement, and Phenomena, Jan./Feb. 2012, vol. 30, No. 1, pp. 010605-1-010605-5.

N. E. Sosa, C. Chen, J. Liu, T. J. Marks, M. C. Hersam, "Large-scale, nonsubtractive patterning of transparent conducting oxides by ion bombardment," *Applied Physics Letters*, 2011, vol. 99; pp. 022110-022110-3.

The International Search Report and the Written Opinion issued Jul. 21, 2020 for International Patent Application No. PCT/US19/60183; pp. 1-9.

\* cited by examiner

NANOSCALE RESOLUTION, SPATIALLY-CONTROLLED CONDUCTIVITY MODULATION OF DIELECTRIC MATERIALS USING A FOCUSED ION BEAM

CROSS-REFERENCE TO RELATED APPLICATIONS

The present application is a National Stage of International Application No. PCT/US19/60183, filed Nov. 7, 2019, which claims priority to U.S. provisional patent application No. 62/760,993 that was filed Nov. 14, 2018, the entire contents of both of which are incorporated herein by reference.

REFERENCE TO GOVERNMENT RIGHTS

This invention was made with government support under grant number W911NF-18-1-0429 awarded by the ARMY/ARO. The government has certain rights in the invention.

BACKGROUND

Focused Ion Beam (FIB) has proven to be an extremely effective tool for the nanopatterning of transparent conducting oxides (TCO) via lithographically controlled dopant implantation. Despite being an inherently serial processing tool, FIB has shown potential in large-area milling and implantation, in particular when integrated with pattern generator lithography capabilities. Furthermore, thanks to the higher beam deflection speed and lower settling time compared to electron beams, milling-based ion beam lithography (IBL) has achieved exposure times for large patterns that are comparable to those of electron beam lithography (EBL), and even faster patterning times can be achieved for ion implantation at lower dosage.

SUMMARY

Provided are methods for modulating the conductivity of a dielectric material to create conductive features therein using a FIB. The modified dielectric materials are also provided.

In one aspect, methods for creating a conductive feature in a dielectric material are provided. In an embodiment, such a method comprises irradiating a region of a dielectric material having a resistivity of at least $10^8$ Ωcm with a focused ion beam, the irradiated region corresponding to a conductive feature embedded in the dielectric material, the conductive feature having a conductivity greater than that of the dielectric material; and forming one or more contact pads of a conductive material in electrical communication with the conductive feature, the one or more contact pads configured to apply a voltage across the conductive feature using a voltage source.

In another aspect, devices comprising modified dielectric material are provided. In an embodiment, such a device comprises a dielectric material having a resistivity of at least $10^8$ Ωcm and a conductive feature embedded in the dielectric material, the conductive feature composed of the dielectric material, but having a conductivity greater than that of the dielectric material; and one or more contact pads of a conductive material, the one or more contact pads in electrical communication with the conductive feature and configured to apply a voltage across the conductive feature using a voltage source. Methods of using the devices are also provided.

Other principal features and advantages of the disclosure will become apparent to those skilled in the art upon review of the following drawings, the detailed description, and the appended claims.

BRIEF DESCRIPTION OF THE DRAWINGS

Illustrative embodiments of the disclosure will hereafter be described with reference to the accompanying drawings.

FIGS. 2A-2D show the electrical characterization of the patterned wires.

FIGS. 3A-3C show the optical and chemical characterization of the patterned wires.

FIG. 6A-6B depict a method for producing and characterizing devices based on structures comprising FIB-patterned vertically aligned nanostructures embedded in a dielectric material.

DETAILED DESCRIPTION

Provided are methods for modulating the conductivity of a dielectric material to create conductive features therein using a FIB. The modified dielectric materials, devices incorporating the materials, and methods of using the devices are also provided.

In one aspect, methods for modulating the conductivity of a dielectric material to create conductive features therein are provided. In an embodiment, such a method comprises irradiating a region of a dielectric material with a focused ion beam. As described in the Example below, ions of the focused ion beam are believed to induce defects within the irradiated region of the dielectric material. At least some of these defects are believed to have an energy level associated with them that lies deep within the band gap of the dielectric material. Such defects may be referenced throughout the present disclosure as "traps" or "deep traps." These defects enable electrical conduction within the irradiated region, thereby converting the irradiated region of the insulating dielectric material to a conductive feature. This conductive feature is composed of the dielectric material but exhibits a greater conductivity than the surrounding regions of dielectric material not irradiated with the focused ion beam. Since the formed conductive feature is surrounded on one or more sides by the dielectric material, the conductive feature may be referred to as being "embedded" in the original dielectric material. As demonstrated in the Example, below, the conductivity of the conductive feature may be as much as $10^{15}$ greater than that of the surrounding regions of dielectric material. This is a giant and unprecedented increase in conductivity.

The dielectric material may have a bandgap above 1 eV. This includes dielectric materials having a bandgap of at least 4 eV, at least 5 eV, at least 6 eV. Oxides may be used for the dielectric material. Titanium dioxide ($TiO_2$) and silicon dioxide ($SiO_2$) are suitable oxides. Aluminum oxide ($Al_2O_3$) is another suitable oxide. $Al_2O_3$ is one of the most widely employed dielectric materials, thanks to its excellent insulating properties, mechanical hardness and resistance, and biocompatibility, with applications ranging from device passivation, MOSFET gate, to biomedical implants and antifouling passivation. SiN is another suitable dielectric material.

Other dielectric materials having a resistivity which is the same as or greater than bulk $Al_2O_3$ ($10^{16}$ Ωcm) may be used. Other dielectric materials having a resistivity of at least $10^8$ Ωcm, at least $10^9$ Ωcm, at least $10^{10}$ Ωcm, at least $10^{11}$ Ωcm, at least $10^{12}$ Ωcm, at least $10^{13}$ Ωcm, at least $10^{14}$ Ωcm, or at least $10^{15}$ Ωcm may be used. These resistivities refer to those measured at room temperature and using a standard electrical test station (e.g., Agilent 4285A LCR meter). Thus, the present dielectric materials are insulators. This distinguishes the present dielectric materials from oxides such as $In_2O_3$, ZnO, and $SnO_2$, which are used to form transparent conductive oxides. Although such oxides are generally doped to increase their conductivity, the conductivity of the undoped oxides themselves is substantially greater than that of the present dielectric materials. By way of illustration, the resistivity of $In_2O_3$ is about 1 Ωcm (as compared to $10^{16}$ Ωcm for $Al_2O_3$).

The dielectric material may be used in bulk form (i.e., a piece of sapphire) or as a layer of the dielectric material (e.g., a thin layer grown using atomic layer deposition (ALD)) may be used. The thin layer may have a thickness of no more than 50 nm, no more than 25 nm, or no more than 10 nm. The dielectric material may be crystalline in nature, e.g., sapphire, but it may alternatively be amorphous in nature, e.g., ALD-grown $Al_2O_3$.

The focused ion beam may be provided by a focused ion beam (FIB) instrument, the type of which is not particularly limited. Commercially available FIB instruments may be used. The ion source for the focused ion beam may be a gallium (Ga) ion source, although other ion sources may be used. The energy and current of the focused ion beam may be selected to provide a desired spot size and a desired ion dosage. As further described in the Example, below, the ion dosage may be adjusted to provide a desired conductivity (e.g., maximum conductivity) for conductive feature(s) formed in the dielectric material. (See FIG. 2B.) However, generally, the focused ion beam energy and ion dosage are relatively high to achieve conductivity and improve resolution. The focused ion beam energy may be in the range of from 15 keV to 50 keV. This includes a range of from 20 keV to 40 keV. The ion dosage may be in the range of from $10^2$ μC/cm$^2$ to $10^6$ μC/cm$^2$. This includes a range of from $10^3$ μC/cm$^2$ to $10^5$ μC/cm$^2$. In embodiments, the focused ion beam energy is about 30 keV and the ion dosage is in the range of from $5*10^3$ μC/cm$^2$ to $5*10^4$ μC/cm$^2$. In addition, the FIB instrument is desirably integrated with patterning software configured to control dosage and charging and to allow for fine alignment, large-area patterning and stage stitching compensation.

The irradiation may be carried out, e.g., by scanning the focused ion beam across the surface of the dielectric material, to form one or more conductive features in the dielectric material, each conductive feature characterized by a particular set of dimensions. Generally, these dimensions include a length and a width (both measured within the plane of the surface of the dielectric material) and a thickness (measured from the top of the surface of the dielectric material downwardly, perpendicular to the plane of the surface). The thickness is related to the depth of the ions implanted into the dielectric material. The thickness may be controlled by energy of the focused ion beam. The length and width depend upon the path taken by the focused ion beam across the surface of the dielectric material.

In general, the values of the length and width and the overall shape of the conductive features is not particularly limited. The thickness can vary, but it does depend upon the focused ion beam instrument used (i.e., via the depth of ion implantation noted above). Generally, the thickness is 50 nm or less or 10 nm to 50 nm. The width of the conductive features may also be nanoscale (e.g., 1000 nm or less, 500 nm or less, 100 nm or less, 20 nm to 250 nm) but microscale widths may be used, e.g., 10 μm or less. The length of the conductive features may be microscale, e.g., 20 μm, 50 μm, 100 μm. In embodiments, the conductive features are nanowires having lengths longer than their widths and thicknesses. (See FIGS. 1A and 1B.) The nanowires can be, but need not be, straight. However, in other embodiments, the conductive features may be in the form of nanostructures having thicknesses of 50 nm or less and both widths and lengths of similar magnitude, e.g., 500 nm or less, 100 nm or less, or 20 nm to 250 nm. (See FIGS. 7A-7B.)

Figure 1A:
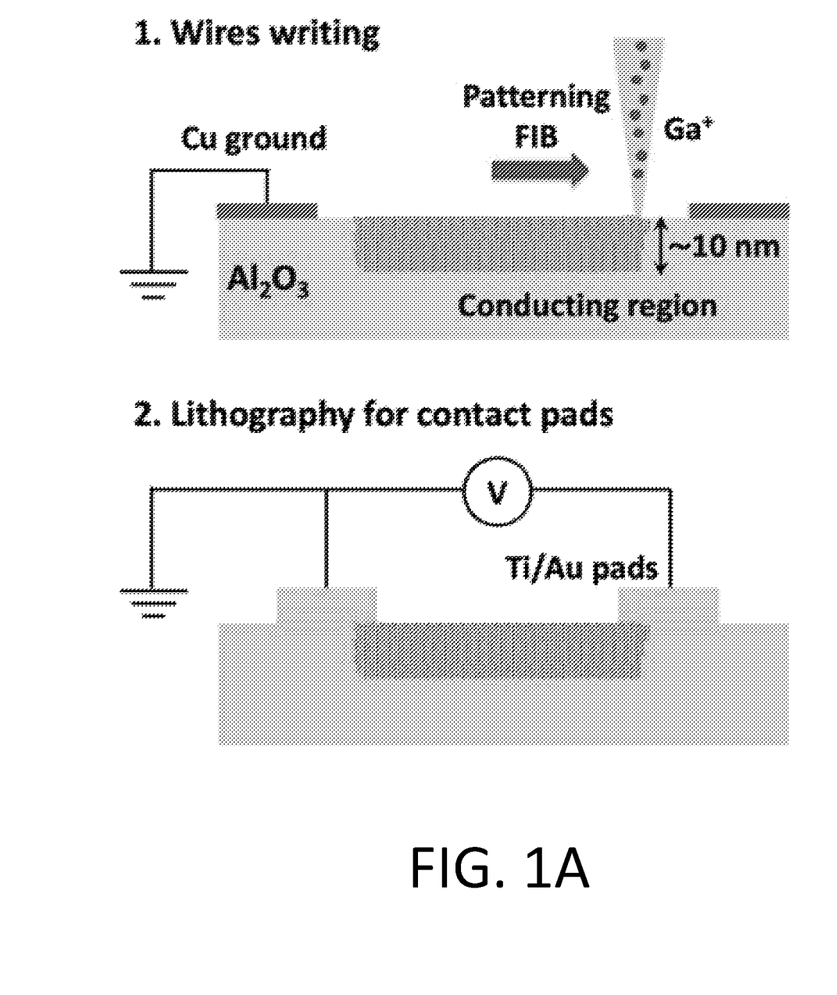
FIG. 1A depicts a method for patterning conductive wires in $Al_2O_3$ according to an illustrative embodiment.
Figure 1B:
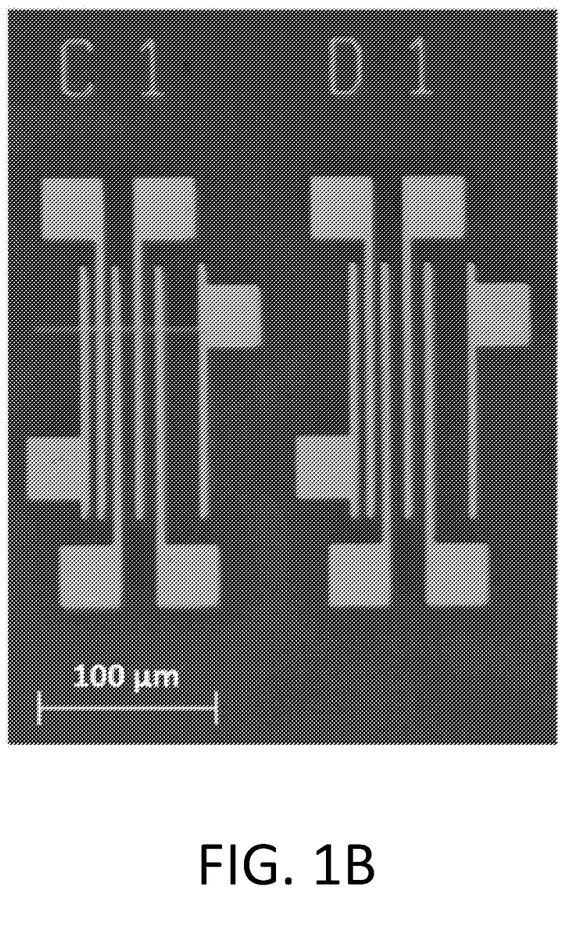
FIG. 1B is a microscope image of fabricated devices including the contact pads and both implanted (left) and non-implanted devices (right).
Figure 1C:
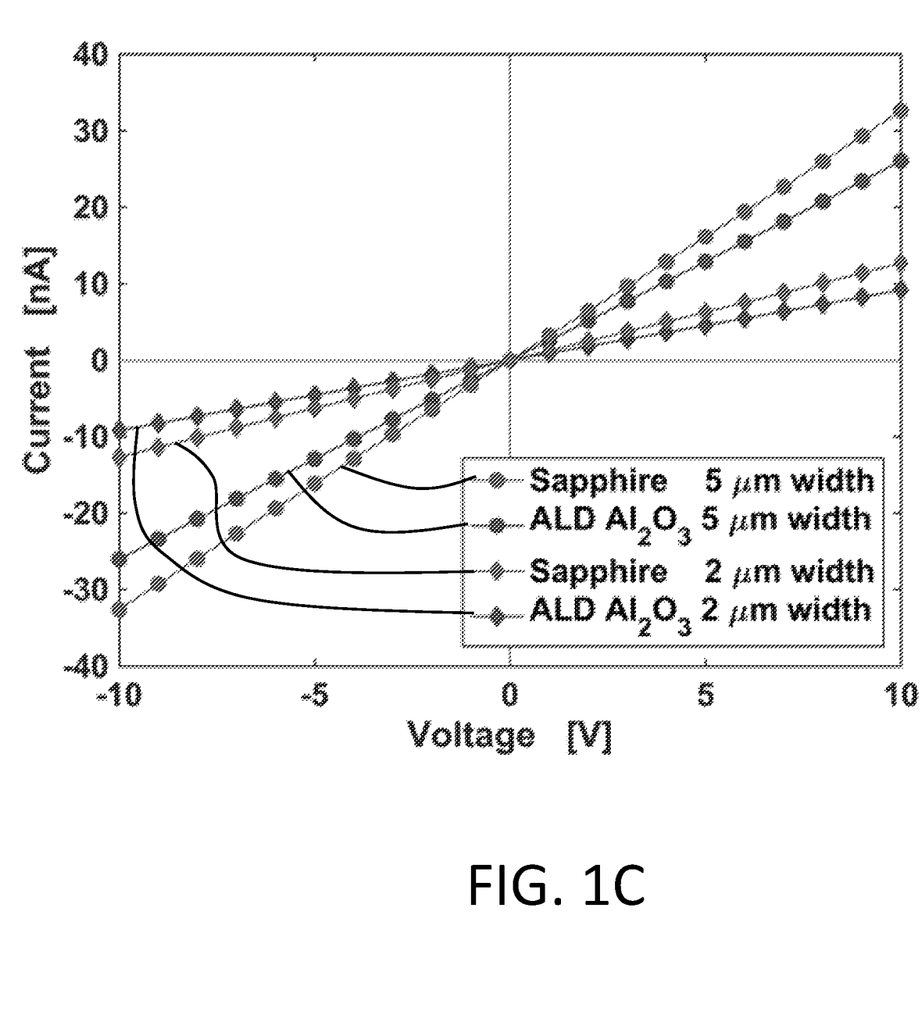
FIG. 1C shows the ohmic current-voltage characteristics of patterned wires of varying widths implanted in bulk sapphire and atomic layer deposition (ALD)-grown $Al_2O_3$.
Figure 2A:
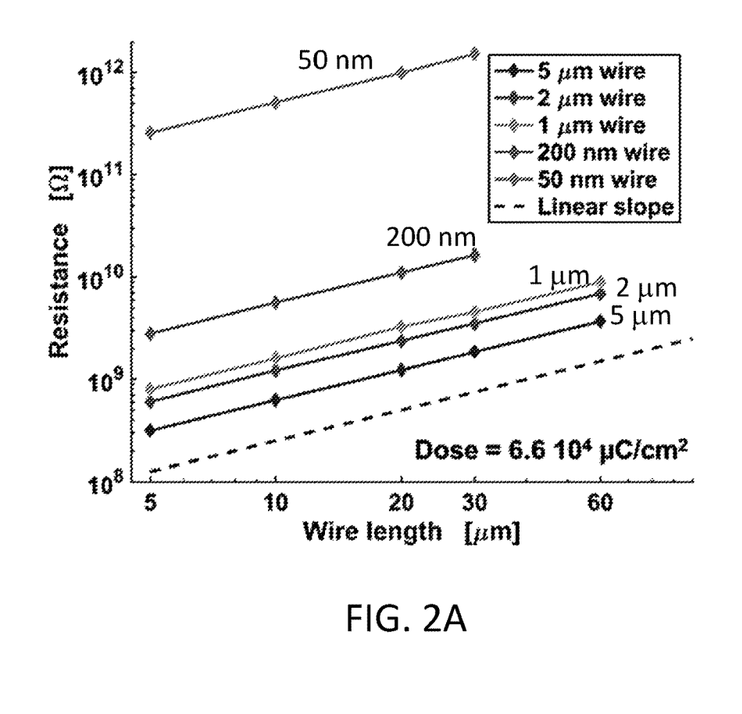
FIG. 2A shows that resistance scales with the wire length and width.
Figure 2B:
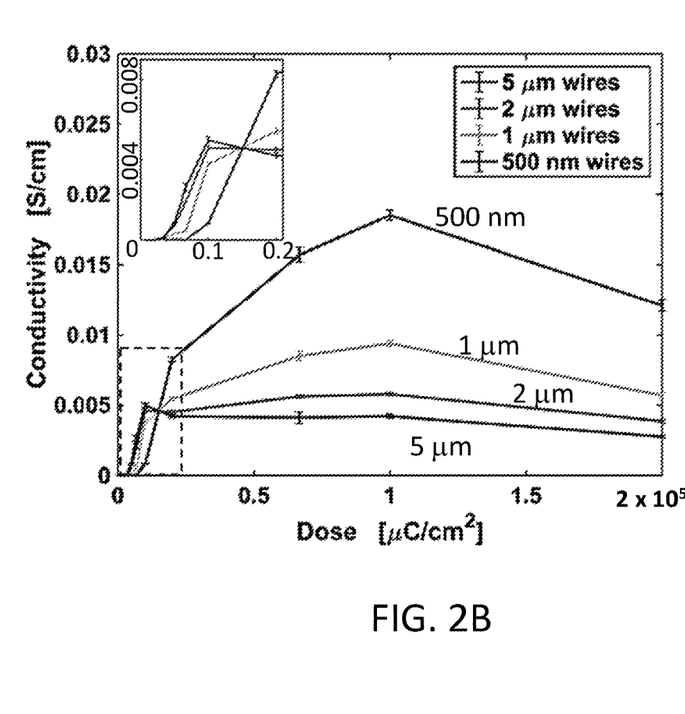
FIG. 2B shows the effect of ion dose on the wire conductivity. Error bars are calculated from a minimum of 5 devices per data point.

As shown in FIG. 1C, conductive features such as nanowires are characterized by ohmic conductivity. As shown in FIGS. 2A-2B, the resistance/conductivity of the conductive features may be tuned by adjusting the dimensions of the features as well as the ion dosage used during irradiation. Regarding ion dosage, the path of the focused ion beam may be selected to form a conductive feature having a predetermined length and a predetermined width. The ion dosage can then be adjusted to maximize conductivity for the conductive feature, e.g., by testing various ion dosages for conductive features having the selected length/width and by selecting the dosage that coincides with a peak in the conductivity. (See FIG. 2B.) The irradiation may be carried out to form a predetermined arrangement or pattern of conductive features in the dielectric material, depending upon the desired application for the modified dielectric material.

The present methods may further comprise forming a patterned metal layer (e.g., formed of Cu) on the surface of the dielectric material prior to irradiation with the focused ion beam to facilitate alignment of the conductive feature(s) to be formed. The pattern is not particularly limited, but rather depends upon the desired dimensions/pattern for the conductive feature(s). Alternatively, an anticharging layer (e.g., Au) may be formed on the surface of the dielectric material prior to irradiation.

The present methods may further comprise forming contact pads in electrical communication with the conductive feature(s) so as to apply a voltage across the conductive feature(s). The contact pads are formed of a conductive material, e.g., a metal or a semiconductor. The particular composition of the contact pads may be selected to facilitate trap-assisted tunneling/conduction within the conductive feature(s). That is, by appropriate selection of composition for the contact pads in contact with the conductive feature(s), the conduction band of the contact pads can be aligned with the energy level of the defects (the deep traps) in the conductive feature(s) induced by the focused ion beam. Such alignment increases the efficiency of trap-assisted tunneling/conduction.

After FIB irradiation, the present methods generally do not involve deposition of another material on the conductive feature(s) except for the contact pads noted above. Thus, the formed conductive feature(s) generally do not contact and do not form an interface with another material (other than the contact pads and other than the surrounding dielectric material from which the conductive feature(s) are formed). In embodiments, the formed conductive feature(s) do not contact and do not form an interface with another oxide such as ZnO.

Figure 6A:
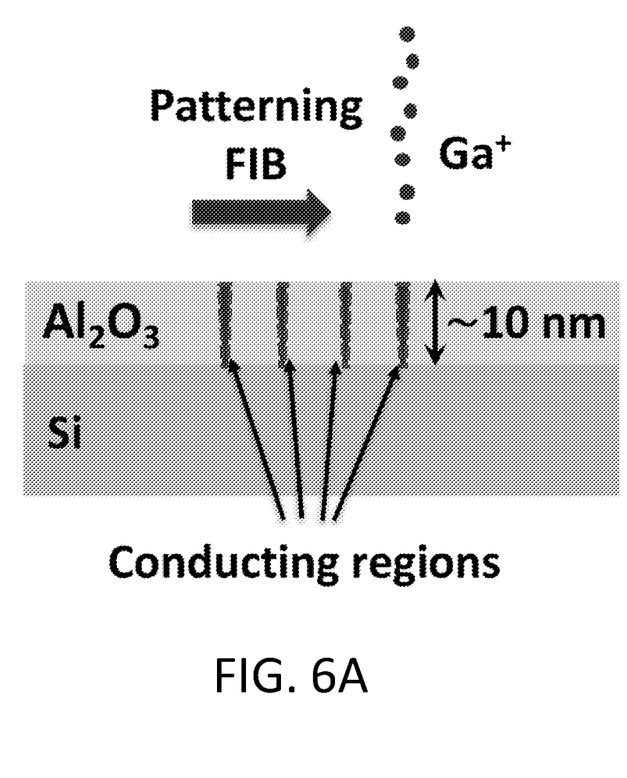
FIG. 6A shows a schematic of the patterning method.
Figure 6B:
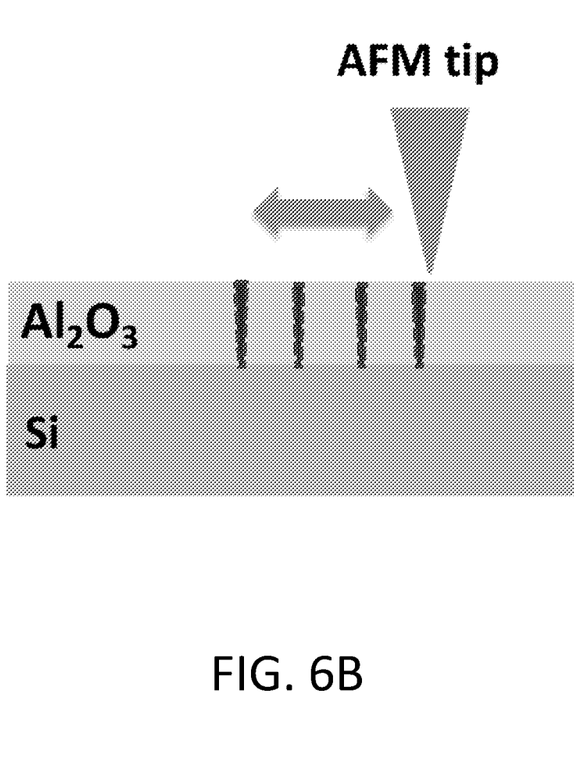
FIG. 6B shows the schematic of the characterization of the resulting conductive features using conductive atomic force microscopy (AFM).

However, as shown in FIGS. 6A-6B, the dielectric material and the conductive feature(s) embedded therein may be disposed on an underlying supporting substrate. In embodiments in which the dielectric material is a thin layer as is shown in FIGS. 6A-6B, the embedded conductive features may also be in direct contact with the supporting substrate. Various materials may be used for the supporting substrate, e.g., Si and other semiconductors.

The conductivity in the dielectric material induced by the present methods may be reversible, i.e., the conductive features may be "erased" by undoing the ion-induced damage described above. This may be accomplished by annealing the modified dielectric material in an oxidizing atmosphere at an elevated temperature and for a period of time. (See, FIG. 2C, annealing in $O_2$ at 750° C.). By "erased" it is meant that the conductivity of the conductive feature after annealing is the same as the conductivity of the surrounding dielectric material. The "same" does not necessarily mean perfectly equal, but could be within ±2%, ±5%, ±10%.

The modified dielectric materials formed using the present methods are also provided. The conductive features within the modified dielectric materials are characterized by conductivities which are significantly greater (i.e., resistivities which are significantly smaller) than the unmodified dielectric material. By "unmodified dielectric material" it is meant the dielectric material, or a region thereof, which has not been irradiated with the focused ion beam. The increase in conductivity may be measured and reported as a conductivity ratio as described in the Example (see Table 1). The conductivity ratio is the ratio of the conductivity of the conductive feature to the conductivity of the dielectric material from which the conductive feature is formed (i.e., the unmodified dielectric material). In embodiments, a conductive feature of a modified dielectric material exhibits a conductivity ratio of at least $10^5$, at least $10^6$, at least $10^7$, at least $10^8$, at least $10^9$, at least $10^{10}$, at least $10^{11}$, at least $10^{12}$, at least $10^{13}$, at least $10^{14}$, or at least $10^{15}$.

The modified dielectric materials find use in a wide variety of applications as described in the Example, below, including as components in low-capacitance electronic sensing devices; high-sensitivity, passivated photon detectors; bio-encapsulation of biomedical sensing devices; resistance-switching devices; and charge-separation devices. Thus, devices including the modified dielectric materials are also provided. For example, medical implants with electrodes can significantly benefit from an inert and biocompatible $Al_2O_3$ encapsulation that is converted to a conductor in exactly the location of electrodes.

EXAMPLE

Introduction

This Example presents an effective method for the non-subtractive nanopatterning of electrically conductive wire and other features embedded in a dielectric aluminum oxide substrate, using FIB. While patterning of nanowires in transparent conductive $In_2O_3$ has been demonstrated using FIB, the conductivity modulation was limited to 4 orders of magnitude. (N. E. Sosa et al., Advanced Materials 2009, 21, 721; and N. E. Sosa et al., Journal of American Chemical Society 2010, 132, 7347) This Example shows nanopatterning of conductive zones in highly insulating $Al_2O_3$ using FIB to achieve a conductivity modulation of 14 orders of magnitude as compared to unmodified $Al_2O_3$. This is believed to be the highest reported change in conductivity using FIB. Controllable and scalable nanopatterning of conductive wires in $Al_2O_3$ may be used to provide low-capacitance sensing devices embedded in strongly insulating dielectric films useful for a wide range of applications, such as photon emission and detection, low-energy interconnects, energy conversion, and implantable devices.

Experimental Section

The dielectric materials used included 300 μm thick, double-side polished <0001> crystalline sapphire substrates as well as $Al_2O_3$ films deposited on both silicon and sapphire substrates (using a Cambridge NanoTech Savannah S100 atomic layer deposition from Trimethylaluminum and water vapor precursors at 150° C.). An 80 nm Cu layer with an alignment mark pattern was deposited on samples before implantation using photolithographic lift-off techniques. The metallic layer was connected to ground during implantation. A FEI Nova 600 NanoLab dual-beam microscope with a Sidewinder $Ga^+$ ion column and a 100 nm resolution piezo-motor X-Y stage was employed for the wire implantation at ion beam energies of 5 and 30 keV and currents of 100 pA, 3.2, and 6.3 nA, yielding estimated spot sizes ranging from 20 to 60 nm. The instrument was combined with a RAITH Elphy 4.0 interface with integrated 16-bit DAC pattern generator, which enables large area patterning and write-field alignment, accounts for stitching and drift, and allows for precise dose control via beam blank and deflection. The Elphy interface allows for a multi-pass patterning technique, which helps contrast the strong charging in dielectrics. Nevertheless, the effective dose is estimated to be lower than the nominal value, due to sputtering and localized charging deflecting the incident ions. The Ti/Au contacts were subsequently deposited with photolithographic lift-off techniques, and electrical testing was performed with a 4-point probe station equipped with Agilent 4285A LCR meter. PL spectra were acquired using a HORIBA LabRAM HR Evolution confocal Raman, equipped with 473 nm, 532 nm, 633 nm, and 785 nm lasers for excitation.

Results and Discussion

A schematic of the method is shown in FIG. 1A. The fabrication process is highly tunable and extremely versatile. It can be applied to both bulk $Al_2O_3$ (i.e., sapphire) and thin film $Al_2O_3$ (e.g., ALD $Al_2O_3$). In order to limit the effects of charging (inherent to FIB processing of insulating substrates), a metallic alignment pattern (Cu) was deposited on the sample before implantation using lithographic techniques as described above. This metallic film serves a dual purpose. First, it is connected to ground during implantation so as to avoid excessive charging of the substrate and to facilitate the focusing of the ion beam. Second, it facilitates the alignment of the implanted wires for the subsequent processing steps. Alternatively, in order to further improve the spatial resolution of the patterned nanowires, an anticharging thin layer of Au can be deposited over the whole area of the sample before implantation and subsequently removed.

As shown in FIG. 1C, all the implanted wire-like structures exhibit ohmic behavior. The figure also shows that both bulk sapphire substrates and ALD deposited $Al_2O_3$ films yield similar results in terms of electrical conductivity.

Figure 4:
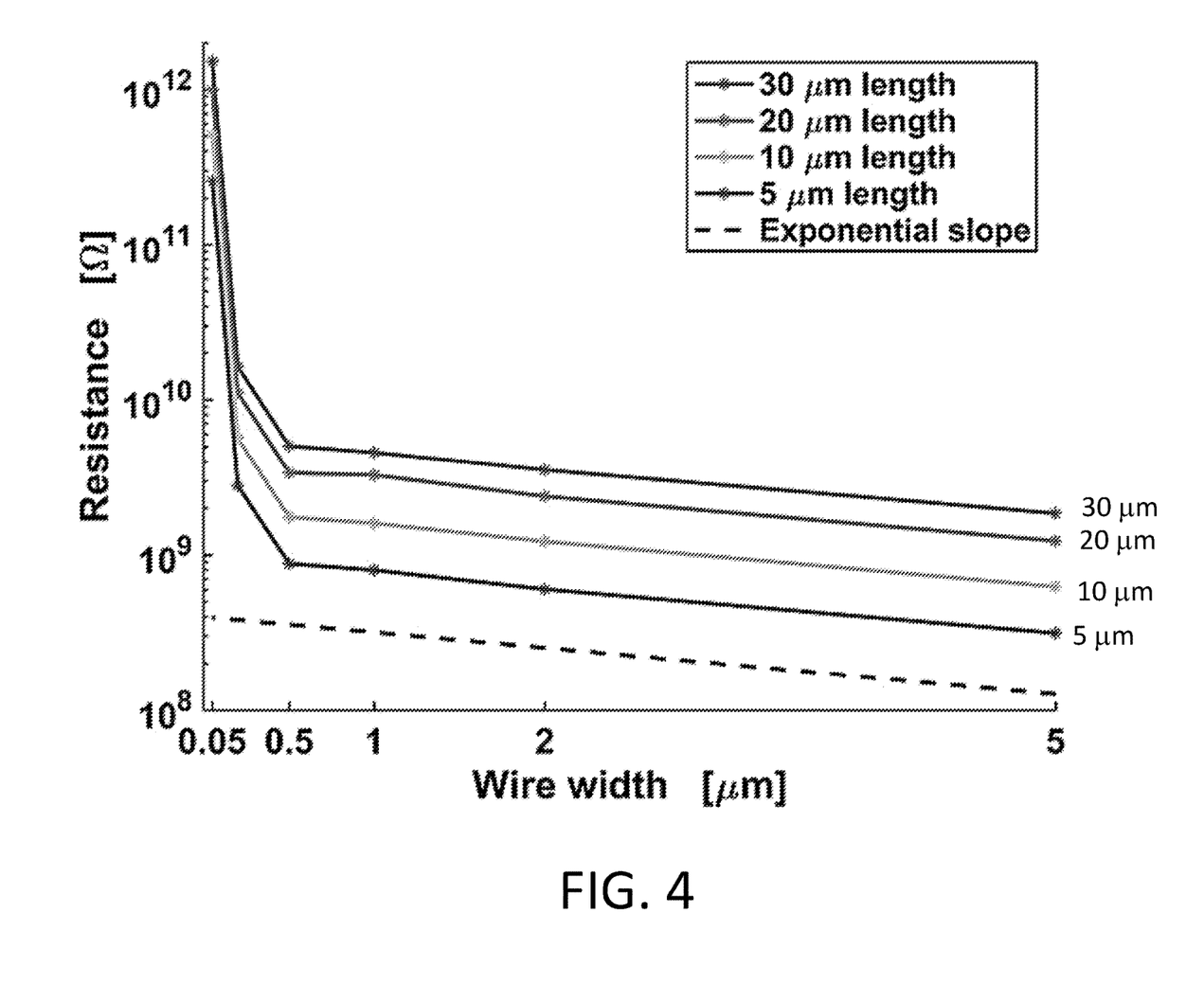
FIG. 4 shows electrical resistance as a function of wire width for the same devices reported in FIG. 2A. As can be inferred from the figure, the resistivity scales exponentially with the width of the wires down to 500 nm, then increases super-exponentially at smaller widths, presumably due to discontinuities in the patterned nanowires, as the wire dimension approaches the spot size of the focused ion beam.

The electrical conductivity of the patterned nanowires is mainly determined by two factors: the geometrical size of the wires and the ion dose. As shown in FIG. 2A, the electrical conductivity scales linearly with the wire length (see also FIG. 4). Based on measurements on a very large number of devices, the method has been shown to be very robust and highly reproducible (data not shown). The effect of implantation dose on the electrical characteristics of the wires is shown in FIG. 2B: the conductivity of the nanowires can be made to vary by a few orders of magnitude within the range of doses explored. Notably, the conductivity reaches its maximum at a certain dose and then plateaus and falls off at higher doses. Moreover, such peaks occur at higher doses for thinner wires, possibly due to the raster scanning of the patterning ion beam that allows for a better mitigation of the charging effect in larger area patterns. Nanopatterning of smaller wires is characterized by a more localized charging, which could deflect the incident ion beam and result in a lower effective dose delivered to the substrate.

Figure 2C:
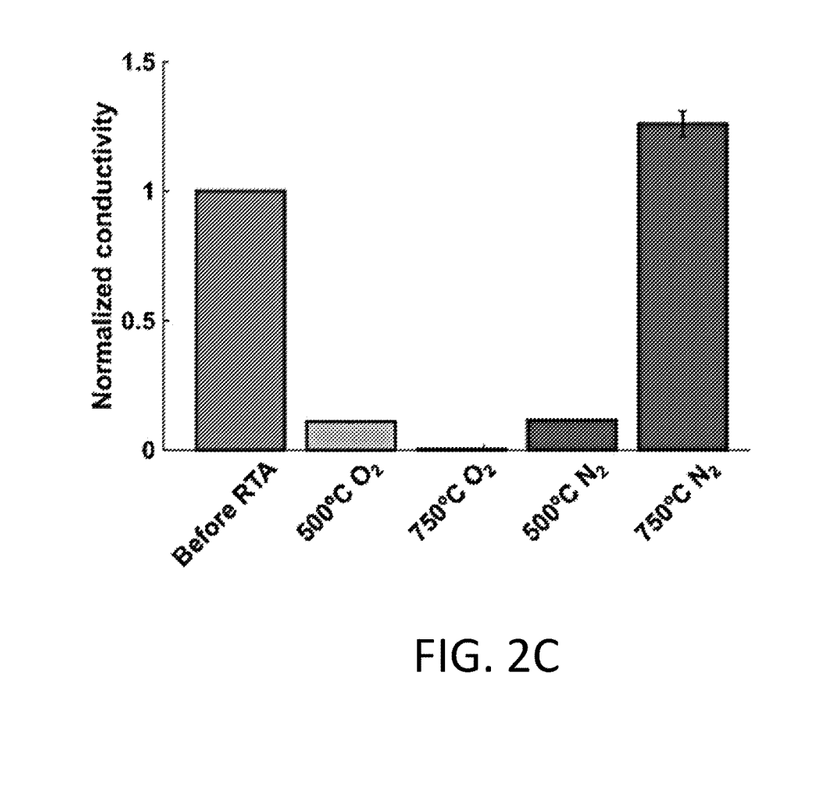
FIG. 2C shows the effect of a rapid thermal annealing (RTA) treatment on the conductivity of patterned $Al_2O_3$ wires. 4 different samples were treated with 15 s of RTA in different environment and temperatures: the error bars are calculated from a minimum of 3 devices per data point.
Figure 5:
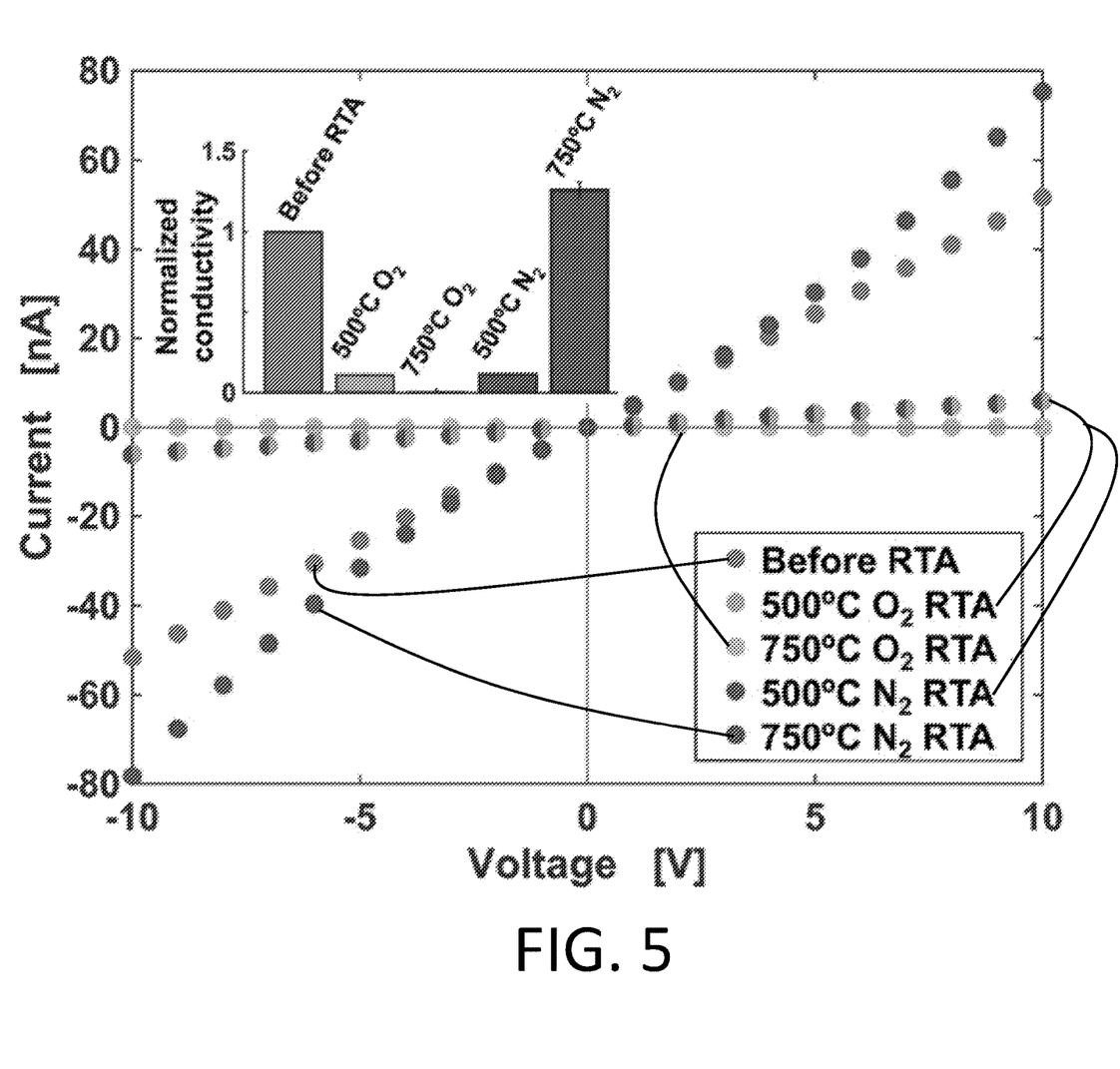
FIG. 5 shows the current-voltage characteristics of a set of patterned wires subjected to RTA treatments. The bar graph of FIG. 2C is included in the inset.

Without wishing to be bound to any particular theory, it is believed that the origin of the conductivity may be the result of damage-induced defects in the material that creates deep trap states in the bandgap, which intrinsically act as dopants, enabling electrical conduction in an otherwise highly insulating material. To determine if the damage-induced defects could be reversed, an annealing study was performed. The results of a rapid thermal annealing (RTA) treatment are shown in FIG. 2C (see also FIG. 5). Specifically, annealing at 750° C. in an oxidizing environment effectively erases the implanted wire, reducing the electrical conductivity to negligible levels, while annealing in a reducing environment induces a higher conductivity in both the implanted wires and the non-implanted $Al_2O_3$ matrix. RTA treatments performed at 500° C. result in a slight decrease in conductivity in both chemical environments, presumably due to incomplete activation of the defect annealing at such temperature. These results suggest that the electrical conductivity of the patterned wires is related to ion damage-induced chemical and structural modification of the $Al_2O_3$ matrix, rather than the implanted Ga ions.

Figure 2D:
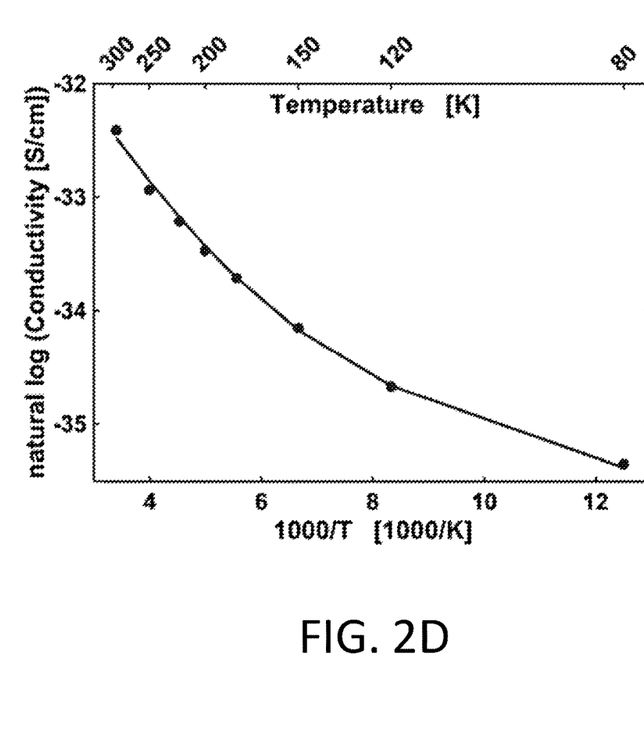
FIG. 2D shows an Arrhenius plot of the conductivity of patterned wires. The solid lines represent the fit used to estimate the activation energies, according to the model in equation 1.

To further evaluate the nature of the charge transport mechanism, temperature-dependent conductivity characterization of the implanted devices was performed. The results are shown in FIG. 2D. Transport in a wide bandgap dielectric such as $Al_2O_3$ is governed by hopping conduction mechanisms of two types: direct trap-to-trap tunneling and phonon-assisted elastic and inelastic tunneling. For both conduction mechanisms, temperature affects the density of free carriers, due to the thermal excitation of electrons at the trap sites, and the carrier mobility, due to the thermally activated phonon scattering. Therefore, the temperature dependency of the conductivity $\sigma = nq\mu$ can be modeled as $$\sigma = \alpha T^{-3/2} \exp\left(-\frac{E_{ACT}}{k_B T}\right),$$

where $\alpha$ is a fitting parameter, $k_B$ is Boltzmann's constant, and $E_{ACT}$ is the activation energy in units of electron-volt. Within the range of the temperatures investigated here, two conduction regimes are observed: one dominated by thermally activated phonons at higher temperatures (T>200 K), and one by direct hopping at lower temperatures; hence, a good fit to the experimental data ($R^2=0.994$) is only possible by adding two functions of the form of equation 1, with estimated activation energies of 96 meV and 50 meV.

Figure 3A:
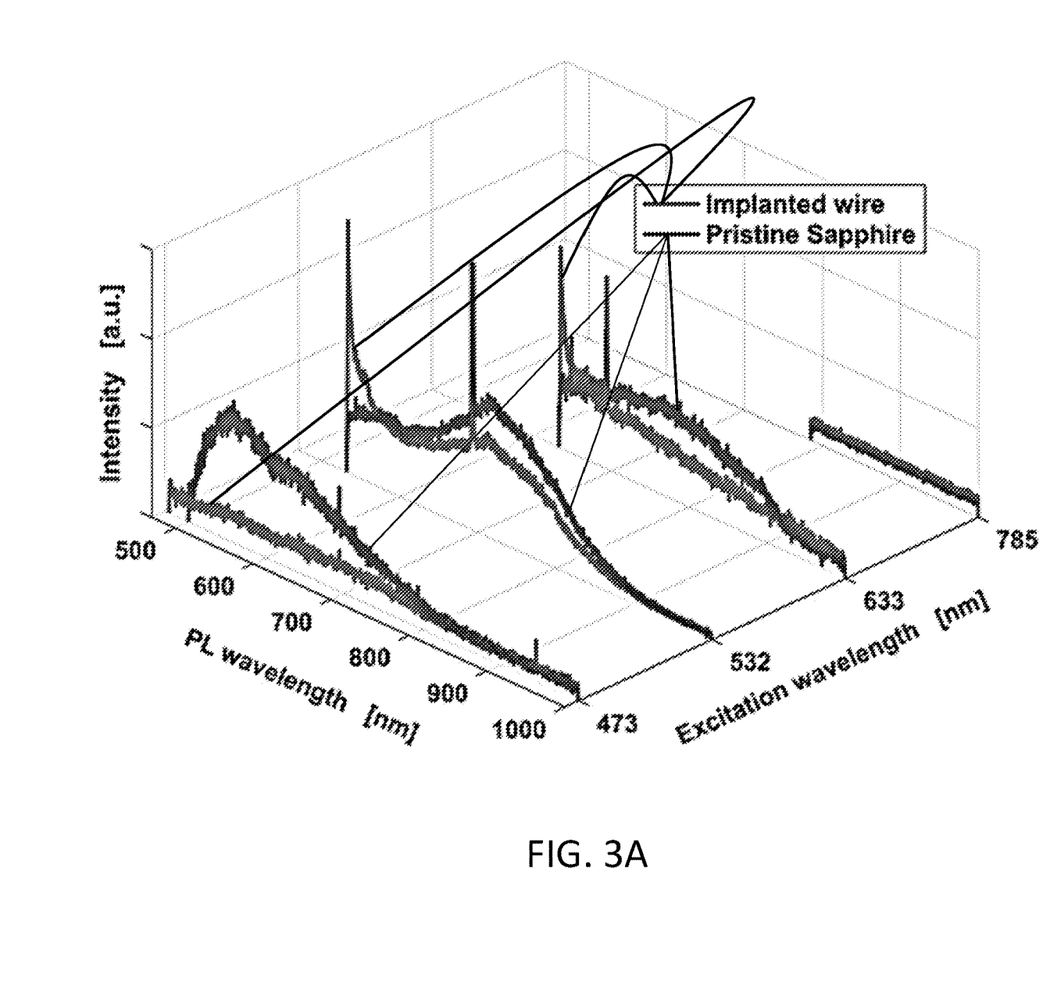
FIG. 3A shows photoluminescence (PL) maps of implanted wire and pristine sapphire for different excitation wavelengths.
Figure 3B:
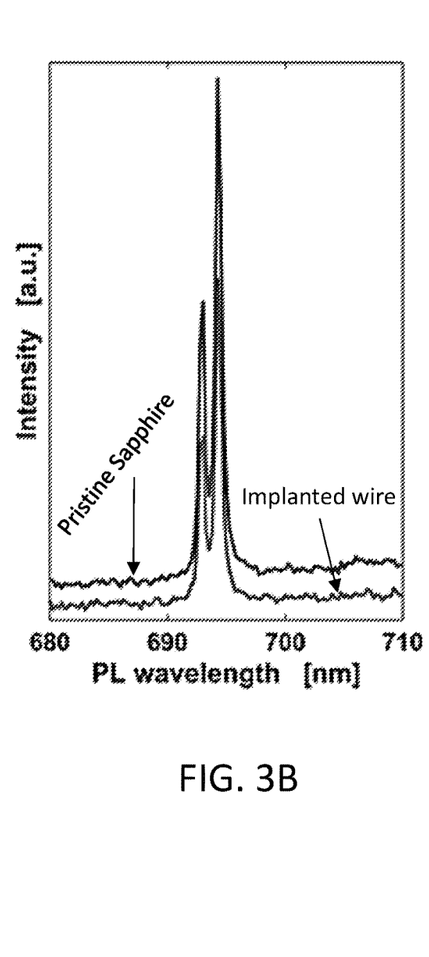
FIG. 3B shows a region of the PL spectrum for 532 nm excitation wavelength, showing the $Cr^{3+}$ peaks for both implanted wire and pristine sapphire.
Figure 3C:
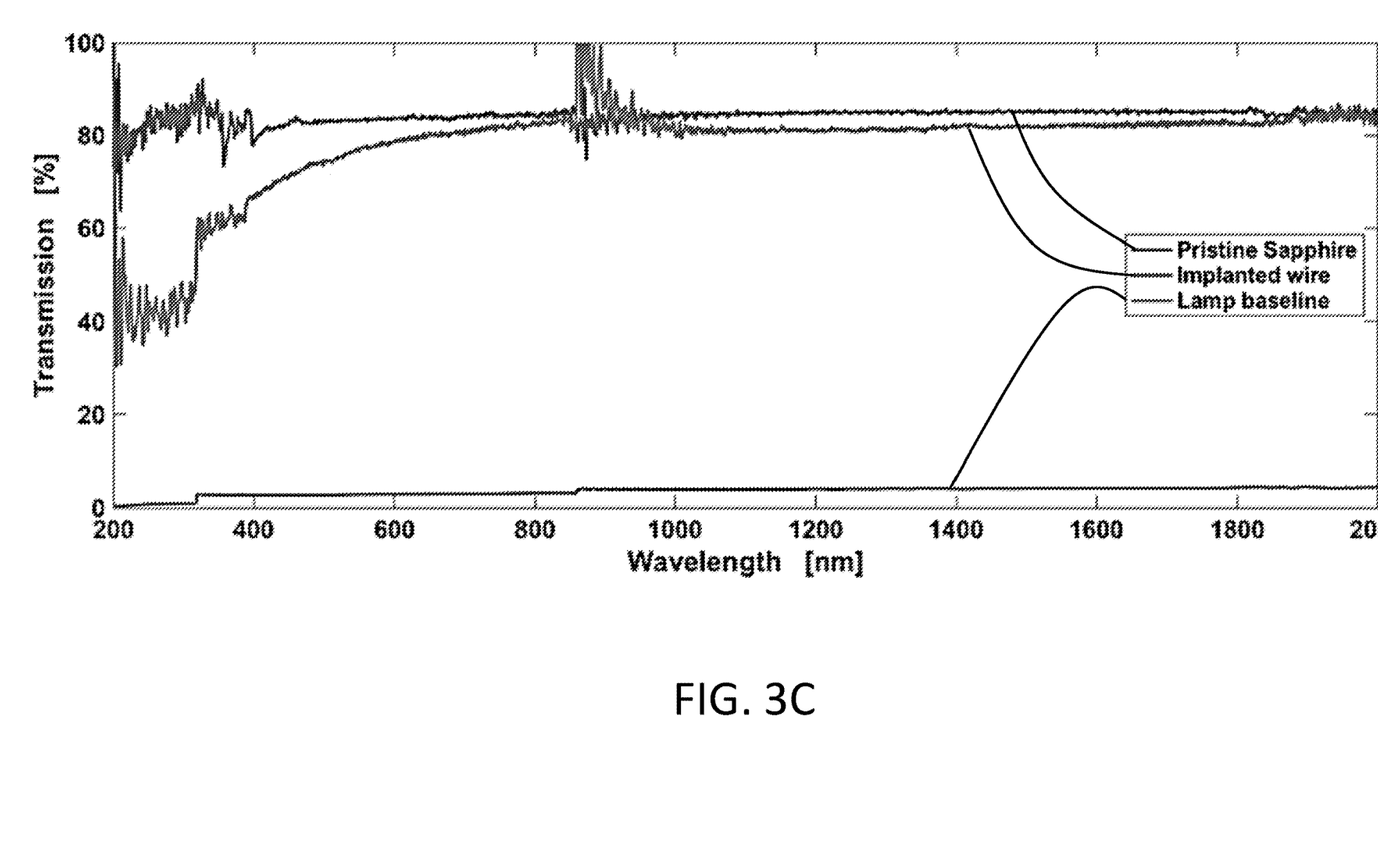
FIG. 3C shows optical transmission as a function of wavelength for implanted wire and pristine sapphire.

The effect of the implantation on the optical properties of sapphire was also evaluated (FIGS. 3A-3C). The results show a significant change in the PL and transmission spectra of implanted samples as compared to the pristine sapphire. These measurements also suggest the ion damage-induced formation of trap states within the oxide bandgap. While the change in both PL and transmission due to implantation spans over a large range of wavelengths, interestingly, the characteristic $Cr^{3+}$ impurity peak shown in FIG. 3B is unaffected by the implantation process, hence suggesting a wider energy distribution of trap states in the bandgap as compared to atomic transition levels.

CONCLUSIONS

In summary, a novel method for nanopatterning conductive zones in $Al_2O_3$ matrix using FIB irradiation has been presented. The implanted wires exhibit ohmic conduction with an average conductivity of $10^{-2}$ S cm$^{-1}$. The method exhibits excellent uniformity and nanoscale spatial resolution and can provide tunable electrical conductivity through control of the ion dose. The electrical, optical, and chemical characterization results provide strong evidence that the conduction mechanism is due to the formation of trap states within the oxide bandgap. All processed devices showed stable performance over several months, after heating to 100° C., and after immersion in liquid solvents.

Additional information, e.g., data indicated as not shown, may be found in U.S. Application No. 62/760,993, which is hereby incorporated by reference in its entirety.

Table 1, below, presents a quantification of the increase in conductivity (compared to the bulk sapphire substrate) of the patterned nanowires reported in this Example, in parallel with the conductivity of ion-implanted $In_2O_3$. The comparison shows that the present methods achieve a giant increase in conductivity in $Al_2O_3$, many orders of magnitude greater than that of $In_2O_3$. Indeed, without wishing to be bound by any particular theory, it is believed that the conduction mechanism in the much larger bandgap, highly resistive $Al_2O_3$ (~6 eV) is altogether different from that of the smaller bandgap, more conductive $In_2O_3$ (~3 eV). Since Ga is a natural dopant of $In_2O_3$, it is believed that the resulting defect states in ion-implanted $In_2O_3$ act as shallow donors which donate electrons to the conduction band of $In_2O_3$. However, dielectrics such as $Al_2O_3$ cannot be similarly doped. As noted above, it is believed that the energy level of the defect states in ion-implanted $Al_2O_3$ are located deep within the $Al_2O_3$ bandgap. As a result, these defect states cannot act as shallow donors to the conduction band. Instead, it is believed that the conduction mechanism relies on trap-assisted tunneling across these deep trap states. Moreover, as the disclosed results show, this conduction mechanism is surprisingly more efficient than that in ion-implanted $In_2O_3$.

TABLE 1

Electrical conductivity modulation of ion-implanted wires in $Al_2O_3$ (this Example) and in $In_2O_3$ in comparison.

| | Resistivity [$\Omega$ cm] | Conductivity ratio (implanted/bulk) |
|---|---|---|
| Bulk Sapphire (E. R. Dobrovinskaya et al., Sapphire, 2009, 55.) | $10^{16}$ | $10^{15}$ |
| Ion-implanted Sapphire (this Example) | $10^1$ | |
| Bulk $In_2O_3$ (Sosa et al., 2009) | >1 | |
| Ion-implanted $In_2O_3$ (Sosa et al., 2009; Sosa et al., 2010; and Dobrovinskaya et al., 2009.) | $2.8\ 10^{-4}$ | $10^4$ |

Figure 7A:
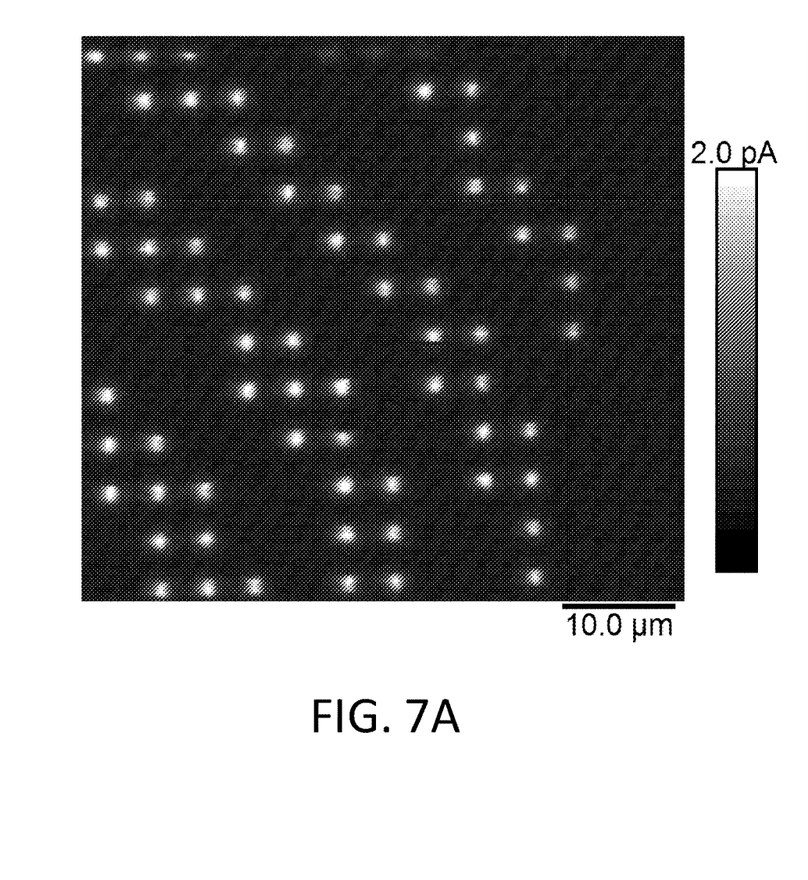
FIG. 7A-7B show the conductivity map obtained from conductive AFM measurements of two vertically aligned conductive patterns embedded in 20 nm thick $Al_2O_3$.
Figure 7B:
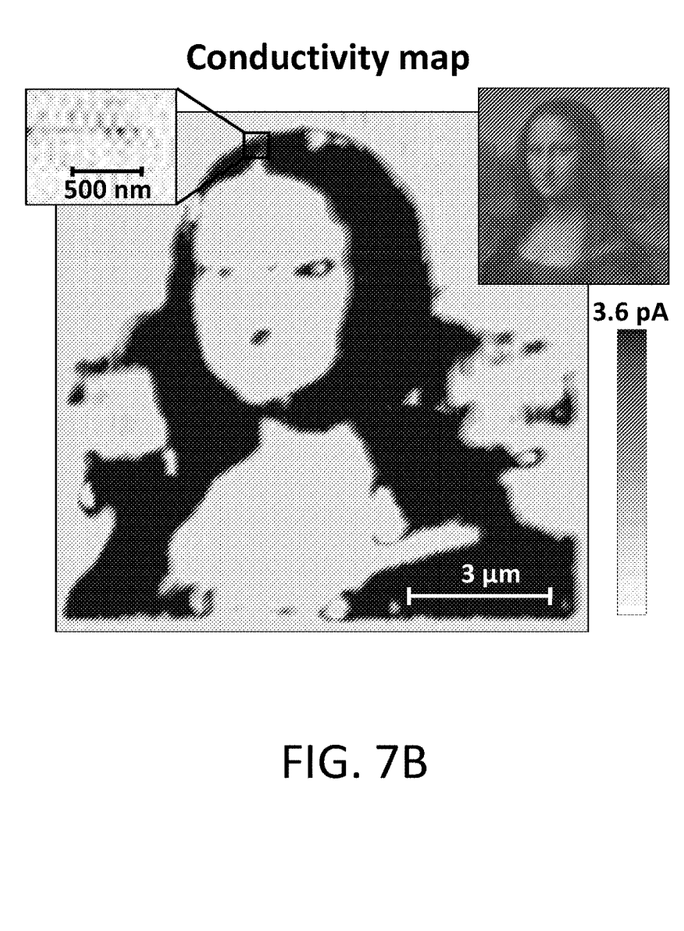
Figure 8A:
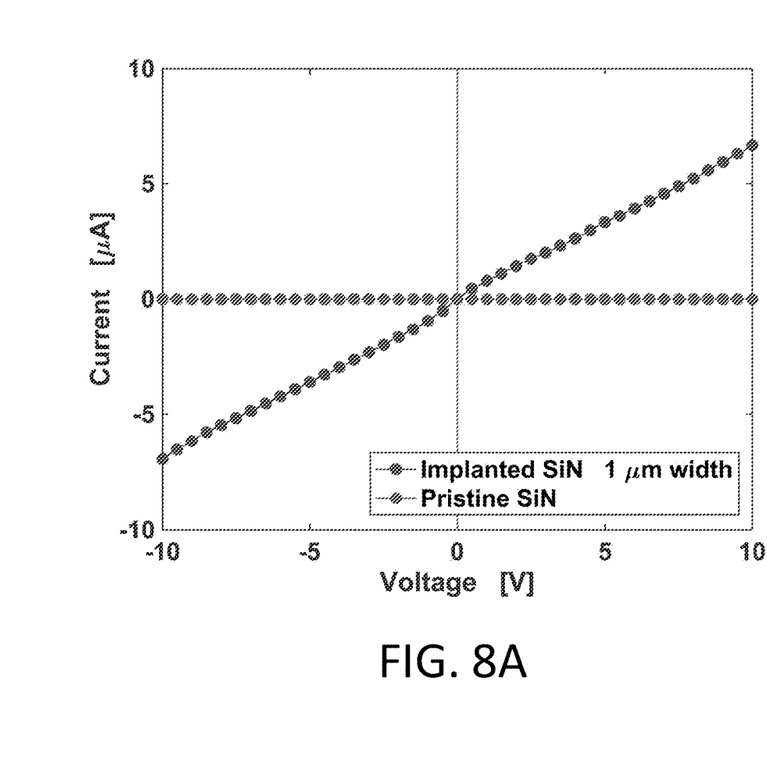
FIG. 8A-8B show the current-voltage characteristics of wires of 1 μm width patterned in SiN and $TiO_2$ thin films deposited on sapphire substrates.
Figure 8B:
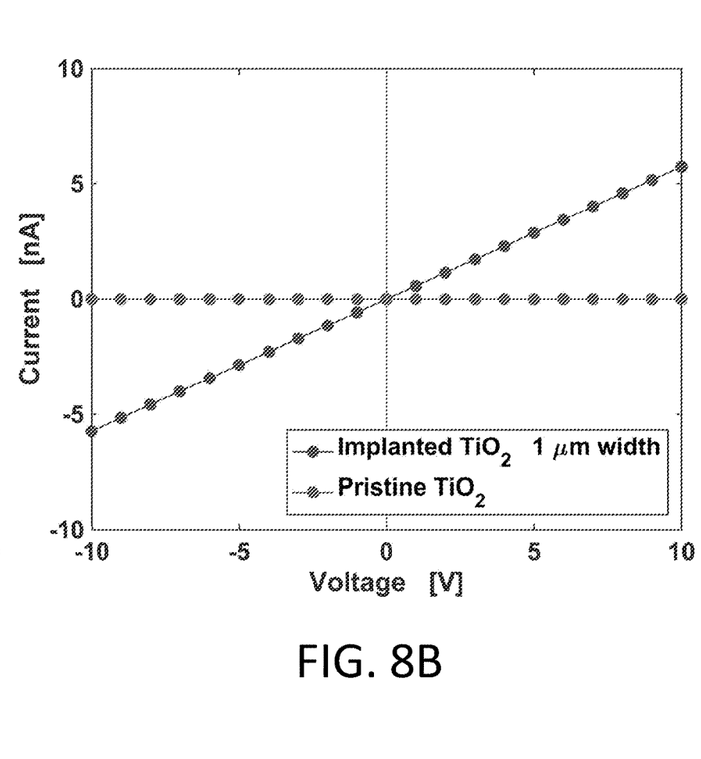

Experiments similar to those described above where carried out on thin layers of $Al_2O_3$ deposited on semiconductor substrates as shown in FIG. 6A. The resulting vertically aligned conductive nanostructures may be characterized with conductive AFM as shown in FIG. 6B. FIGS. 7A and 7B demonstrate that more elaborate patterns of vertically aligned conductive nanostructures may be formed using the present methods. Finally, FIGS. 8A-8B show similar results when similar experiments are carried out using different dielectric materials.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the disclosure has been presented for purposes of illustration and of description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and as practical applications of the disclosure to enable one skilled in the art to utilize the disclosure in various embodiments and with various modifications as suited to the particular use contemplated. It is intended that the scope of the disclosure be defined by the claims appended hereto and their equivalents.

What is claimed is:

1. A method comprising:
   (a) irradiating a region of a dielectric material having a resistivity of at least $10^8$ $\Omega$ cm with a focused ion beam, the irradiated region corresponding to a conductive feature embedded in the dielectric material, the conductive feature having a conductivity greater than that of the dielectric material; and
   (b) forming one or more contact pads of a conductive material in electrical communication with the conductive feature, the one or more contact pads configured to apply a voltage across the conductive feature using a voltage source, the method further comprising heating the conductive feature under an oxidizing atmosphere for a period of time so as to erase the conductive feature.

2. The method of claim 1, wherein the dielectric material is $Al_2O_3$.

3. The method of claim 1, wherein the dielectric material is SiN.

4. The method of claim 1, wherein the dielectric material has a thickness of 50 nm or less.

5. The method of claim 1, wherein the dielectric material is amorphous.

6. The method of claim 1, wherein the conductive material of the one or more contact pads is selected such that its conduction band is aligned with an energy level of defects in the conductive feature induced by the irradiation.

7. The method of claim 1, wherein the conductive feature is a nanowire having a length greater than its width.

8. The method of claim 1, wherein the conductive feature has a predetermined length and a predetermined width and the irradiation is carried out using an ion dosage that provides a peak conductivity at the predetermined length and width.

9. The method of claim 1, wherein the irradiation is carried out using an ion dosage in a range of from $10^2$ $\mu C/cm^2$ to $10^6$ $\mu C/cm^2$ and an ion energy in a range of from 5 keV to 50 keV.

10. The method of claim 1, wherein the dielectric material is $TiO_2$.

11. The method of claim 1, wherein the dielectric material is $SiO_2$.

12. The method of claim 1, wherein the dielectric material has a first surface and a second surface opposite the first surface and further wherein step (b) forms multiple contact pads on the first surface of the dielectric material such that the multiple contact pads are positioned within a plane.

* * * * *